(12) United States Patent
Romanovskyy

(10) Patent No.: US 8,995,180 B2
(45) Date of Patent: Mar. 31, 2015

(54) MAGNETORESISTIVE RANDOM ACCESS MEMORY (MRAM) DIFFERENTIAL BIT CELL AND METHOD OF USE

(71) Applicant: Taiwan Semiconductor Manufacturing Company, Ltd., Hsinchu (TW)

(72) Inventor: Sergiy Romanovskyy, Ottawa (CA)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 300 days.

(21) Appl. No.: 13/689,105

(22) Filed: Nov. 29, 2012

(65) Prior Publication Data
US 2014/0146599 A1   May 29, 2014

(51) Int. Cl.
*G11C 11/16*    (2006.01)
*G11C 11/56*    (2006.01)

(52) U.S. Cl.
CPC ........ *G11C 11/1673* (2013.01); *G11C 11/1675* (2013.01); *G11C 11/16* (2013.01); *G11C 11/5607* (2013.01); *G11C 11/161* (2013.01)
USPC .......................................... 365/158; 365/163

(58) Field of Classification Search
CPC ............................ G11C 11/16; G11C 11/5607
USPC .................................................... 365/158, 163
See application file for complete search history.

(56) References Cited

U.S. PATENT DOCUMENTS

| | | | |
|---|---|---|---|
| 6,885,577 B2 | 4/2005 | Tang et al. | |
| 2004/0047204 A1* | 3/2004 | Hung et al. | 365/202 |
| 2008/0229269 A1* | 9/2008 | Lamorey | 716/12 |
| 2011/0001201 A1 | 1/2011 | Wang et al. | |

* cited by examiner

*Primary Examiner* — Vu Le
(74) *Attorney, Agent, or Firm* — Lowe Hauptman & Ham, LLP

(57) ABSTRACT

A MRAM bit cell including a first magnetic tunnel junction (MTJ) connected to a first data line and a second MTJ connected to a second data line. The MRAM bit cell further includes a first transistor having a first terminal connected to the first MTJ and a second terminal connected to the second MTJ. The MRAM bit cell further includes a second transistor having a first terminal connected to a driving line and a second terminal connected to the first MTJ. The MRAM bit cell further includes a third transistor having a first terminal connected to the driving line and a second terminal connected to the second MTJ. A method of using the MRAM bit cell is also described.

20 Claims, 6 Drawing Sheets

|  | WL | BL | A | B | BLB | SL |
|---|---|---|---|---|---|---|
| Stand-by | 0V | 0V | 0V | 0V | 0V | 0V |
| Read | 1V | 0.2V | <0.2V | <0.2V | 0.2V | 0V |
| Write RL to 102 | 2V | 1V | ~0.3V | <0.3V | 0V | 0V |
| Write RL to 104 | 2V | 1V | >0.7V | ~0.7V | 0V | 1V |
| Write RL to 102 | 2V | 0V | >0.7V | ~0.7V | 1V | 1V |
| Write RL to 104 | 2V | 0V | ~0.3V | <0.3V | 1V | 0V |

Figure 3

|  | WL | BL | A | B | BLB | SL |
|---|---|---|---|---|---|---|
| Stand-by | 0V | 0.2V | 0.2V | 0.2V | 0.2V | 0.2V |
| Read | 1V | 0.2V | ~0.2V | ~0.2V | 0.2V | 0V |
| Write RL to 102 | 2V | 1V | ~0.3V | <0.3V | 0V | 0V |
| Write RL to 104 | 2V | 1V | >0.7V | ~0.7V | 0V | 1V |
| Write RL to 102 | 2V | 0V | >0.7V | ~0.7V | 1V | 1V |
| Write RL to 104 | 2V | 0V | ~0.3V | <0.3V | 1V | 0V |

Figure 4

MAGNETORESISTIVE RANDOM ACCESS MEMORY (MRAM) DIFFERENTIAL BIT CELL AND METHOD OF USE

BACKGROUND

Magnetoresistive random access memory (MRAM) uses magnetic tunnel junctions (MTJs) to store data. An MTJ includes a pinned layer and a free layer separated by a dielectric layer. A relative orientation of the pinned layer and the free layer determines a resistance of the MTJ. The MTJ has a low resistance if the pinned layer and the free layer are oriented in a same direction. The MTJ has a high resistance if the pinned layer and the free layer are oriented in opposite directions. The pinned layer is fixed, so the relative orientation is determined by the free layer. The direction of the free layer is set by passing a high current through the MTJ. The direction of the current determines the orientation of the free layer.

A first MRAM bit cell, in an existing approach, includes an MTJ connected to a bit line and a pass gate transistor. The pass gate transistor selectively connects the MTJ to a source line. In order to perform a read operation on the first MRAM bit cell, a reference voltage is generated for comparison. Generating the reference voltage involves introducing additional circuitry and complexity to a memory array design.

A second MRAM bit cell, in an existing approach, includes two MTJs connected to a bit line and a bit line bar, respectively, and two pass gate transistors. Each of the two transistors selectively connects a corresponding MTJ to a source line. Both pass gate transistors are sufficiently robust to handle the entire current necessary to flip the free layer of each MTJ. The size of the pass gate transistors is a factor in determining the overall size of the MRAM bit cell.

BRIEF DESCRIPTION OF THE DRAWINGS

One or more embodiments are illustrated by way of example, and not by limitation, in the figures of the accompanying drawings, wherein elements having the same reference numeral designations represent like elements throughout. In accordance with standard practice in the industry various features are not drawn to scale and are used for illustration purposes only. In fact, the dimensions of the various features in the drawings may be arbitrarily increased or reduced for clarity of discussion. Features of the current description are displayed as follows:

FIG. 3 is a table of voltage values at various locations of the MRAM bit cell for several operations of the MRAM bit cell in accordance with one or more embodiments;

FIG. 4 is a table of voltage values at various locations of the MRAM bit cell for several operations of the MRAM bit cell in accordance with one or more other embodiments;

DETAILED DESCRIPTION

The following disclosure provides many different embodiments, or examples, for implementing different features of the invention. Specific examples of components and arrangements are described below to simplify the present disclosure. These are examples and are not intended to be limiting.

Figure 1:
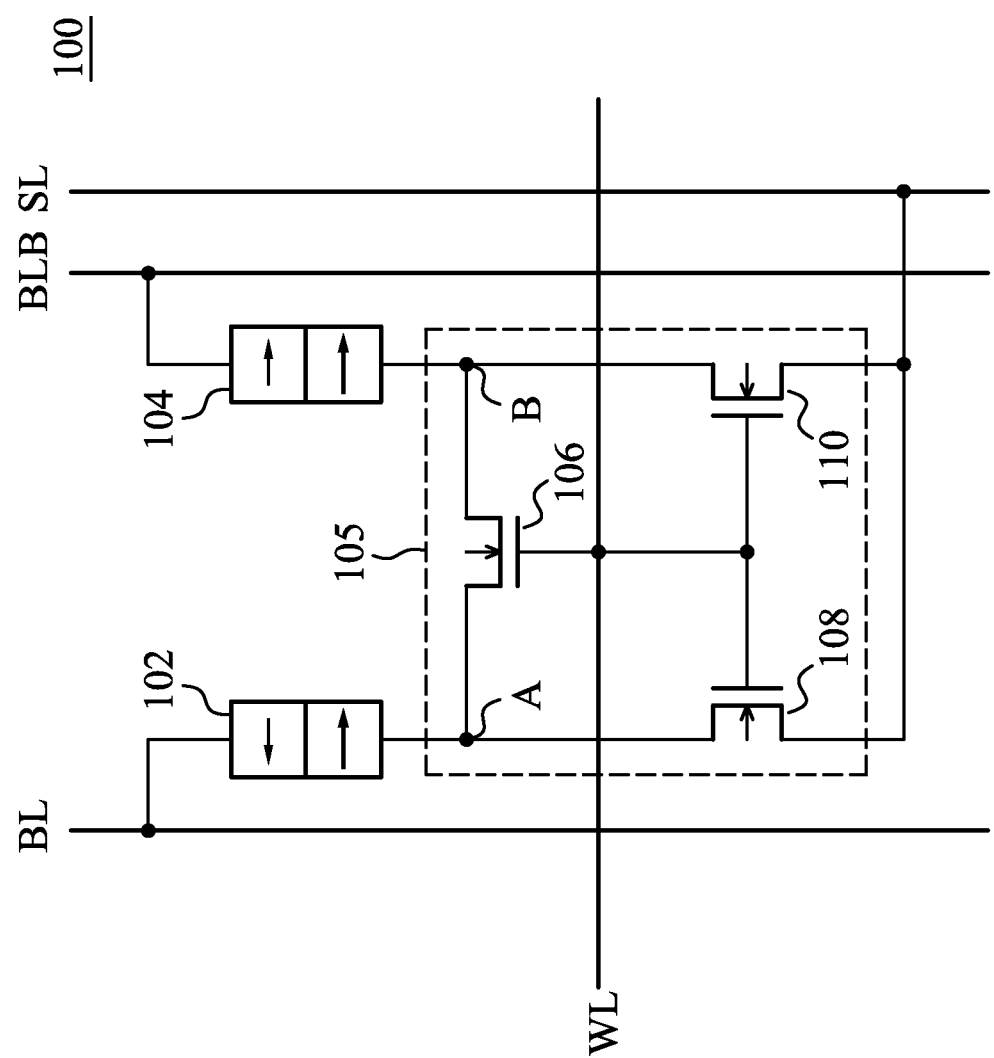
FIG. 1 is a circuit diagram of a magnetoresistive random access memory (MRAM) bit cell in accordance with one or more embodiments.

FIG. 1 is a circuit diagram of a magnetoresistive random access memory (MRAM) bit cell 100, in accordance with one or more embodiments. MRAM bit cell 100 includes a first MTJ 102 and a second MTJ 104. First MTJ 102 is connected to a bit line BL and a pass gate assembly 105. Second MTJ is connected to a bit line bar BLB and pass gate assembly 105. In some embodiments, bit line BL and bit line bar BLB are called data lines because the bit line and bit line bar carry data to and from MRAM bit cell 100. Pass gate assembly 105 is positioned to electrically connect and disconnect a source line SL from first and second MTJs 102 and 104. In some embodiments, source line SL is called a driving line because the source line provides a voltage differential from bit line BL and bit line bar BLB for driving a current through first MTJ 102 and second MTJ 104. Pass gate assembly 105 includes a first pass gate transistor 106 having a source connected to first MTJ 102 through a node A; a drain connected to second MTJ 104 through a node B; and a gate connected to a word line WL. In some embodiments, word line WL is called a control line because the word line controls pass gate assembly 105. Pass gate assembly 105 further includes a second pass gate transistor 108 having a source connected to source line SL; a drain connected to first MTJ 104 through node A and the source of first pass gate transistor 106; and a gate connected to word line WL and the gate of first pass gate transistor 106. Pass gate assembly 105 further includes a third pass gate transistor 110 having a source connected to source line SL; a drain connected to second MTJ 104 through node B and the drain of first pass gate transistor 106; and a gate connected to word line WL and the gates of first pass gate transistor 106 and second pass gate transistor 108. The drain of second pass gate transistor 108 is connected to the source of first pass gate transistor 106. The drain of third pass gate transistor 110 is connected to the drain of first pass gate transistor 106. The sources of second pass gate transistor 108 and third pass gate transistor 110 are connected. MRAM bit cell 100 is also referred to a three transistor two junction (3T2J) MRAM differential bit cell because the bit cell includes three transistors and two MTJs. In the embodiments of FIG. 1, pass gate assembly 105 is connected to a pinned layer of first MTJ 102 and second MTJ 104. Pass gate assembly 105 connected to the pinned layer of the first and second MTJs 102 and 104 is called a standard connection. In some embodiments, pass gate assembly 105 is connected to a free layer of first MTJ 102 and second MTJ 104. Pass gate assembly 105 connected to the free layer of the first and second MTJs 102 and 104 is called a reverse connection.

First MTJ 102 and second MTJ 104 are configured to store complementary data. Data is stored in an MTJ based on a resistance level of the MTJ. The resistance level is capable of flipping between a low resistive state (RL) and a high resistive state (RH). In the low resistive state, a pinned layer and a free layer of the MTJ are oriented in a same direction. In the high resistive state, the pinned layer and the free layer are oriented in opposite directions. In the embodiment depicted in FIG. 1, first MTJ 102 is in a high resistive state, as indicated by opposite pointing arrows in the first MTJ, and second MTJ 104 is in a low resistive state, as indicated by arrows pointing in a same direction in the second MTJ. The structure of MTJs is not discussed in detail for the sake of brevity. A more detailed discussion of the structure of MTJs is provided in U.S. application Ser. No. 12/828,593, filed Jul. 1, 2010, which is incorporated herein by reference in its entirety.

Pass gate assembly 105 is configured to selectively connect and disconnect each of first MTJ 102 and second MTJ 104 to/from source line SL based on a logic state of word line WL. If MRAM bit cell 100 is activated, word line WL is in a logically high state and pass gate 105 electrically connects source line SL to first MTJ 102 and second MTJ 104.

Pass gate assembly 105 include three pass gate transistors 106, 108 and 110, each of which has a gate connected to word line WL. Pass gate transistors 106, 108 and 110 are n-type metal-oxide-semiconductor (NMOS) transistors. In some embodiments, pass gate transistors 106, 108 and 110 are different types of switching elements such as p-type metal-oxide-semiconductor (PMOS), bi-polar junction transistors (BJTs), thyristors or other suitable switching elements.

Pass gate transistors 106, 108 and 110 are sufficiently robust to conduct a current capable of changing a resistive state of first and second MTJs 102 and 104. Each of pass gate transistors 106, 108 and 110 are substantially the same size. In some embodiments, at least one of pass gate transistors 106, 108 and 110 has a different size than at least another of pass gate transistors 106, 108 and 110.

Pass gate assembly 105 is activated based on word line WL. Pass gate transistors 106, 108 and 110 all include gates electrically connected to word line WL. If word line WL is activated, each of pass gate transistors 106, 108 and 110 are activated. Activated pass gate assembly 105 provides two electrical paths from source line SL to each of first MTJ 102 and second MTJ 104. A first electrical path from source line SL to first MTJ 102 is provided through second pass gate transistor 108. A second electrical path from source line SL to first MTJ 102 is provided through third pass gate transistor 110 and first pass gate transistor 106. A first electrical path from source line SL to second MTJ 104 is provided through third pass gate transistor 110. A second electrical path from source line SL to second MTJ 104 is provided through second pass gate transistor 108 and first pass gate transistor 106.

By providing two electrical paths to each of first MTJ 102 and second MTJ 104, a size of pass gate transistors 106, 108 and 110 is reduced with respect to other MRAM bit cell designs having only one electrical path to the first and second MTJs. The size reduction is a result of the ability to share a write current, sufficient to change the resistive state of first and second MTJs 102 and 104, between more than one transistor. Each individual transistor in pass gate assembly 105 does not handle the entire write current. The reduced current passing through each pass gate transistor 106, 108 and 110 allows a size reduction of the pass gate assembly 105 and the overall MRAM bit cell 100. In some embodiments, each pass gate transistor 106, 108 and 110 is approximately half the size of a single transistor capable of handling the write current. Even though pass gate assembly 105 includes three transistors instead of two transistors in other bit cell designs, the size of pass gate assembly 105 is decreased by 25% because of the reduced size of the pass gate assembly.

Figure 6:
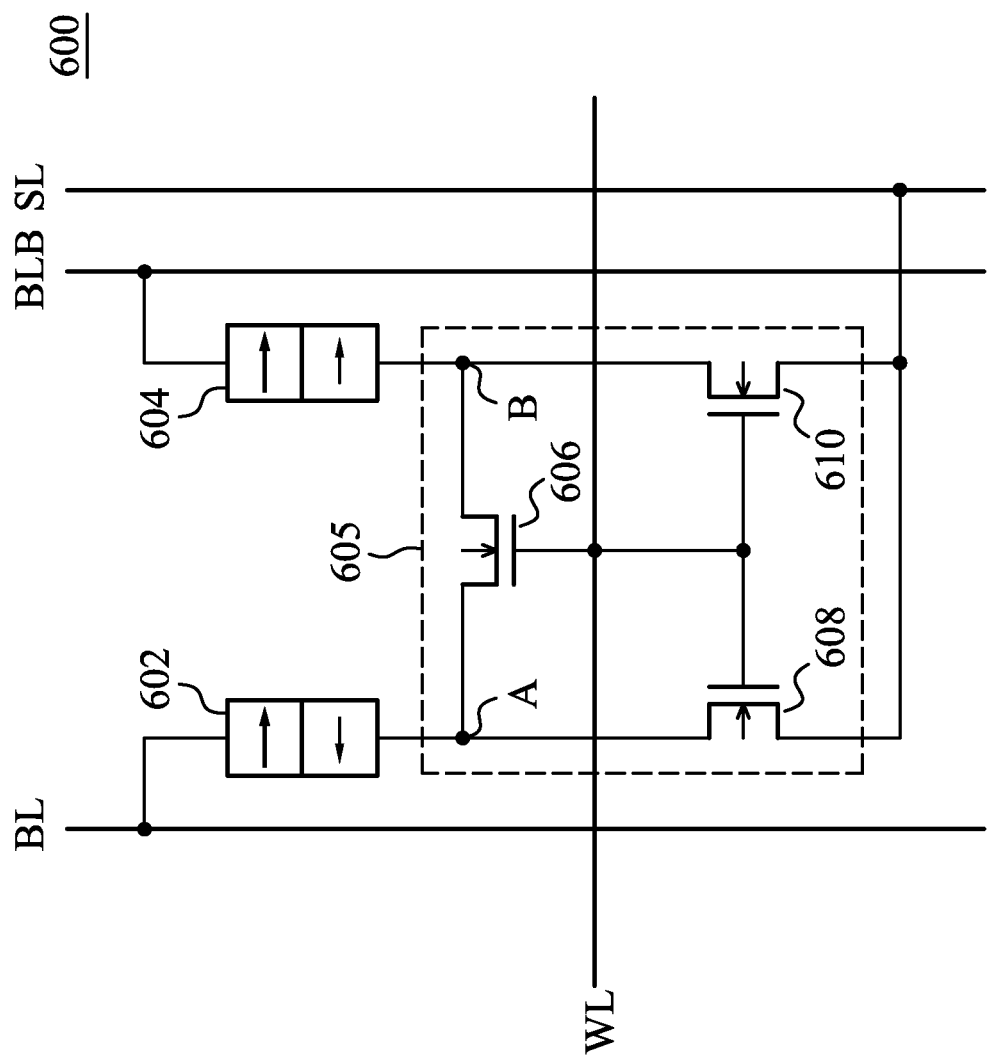
FIG. 6 is a circuit diagram of an MRAM bit cell in accordance with one or more embodiments.

FIG. 6 is a circuit diagram of an MRAM bit cell 600 in accordance with one or more embodiments. MRAM bit cell 600 is similar to MRAM bit cell 100. Reference numbers for MRAM bit cell 600 are the same as for MRAM bit cell 100 increased by 500, e.g., a pass gate assembly 605 is similar to pass gate assembly 105. Pass gate assembly 605 of MRAM bit cell 600 is connected to a free layer of a first MTJ 602 and a second MTJ 604, in the reverse connection.

Figure 2:
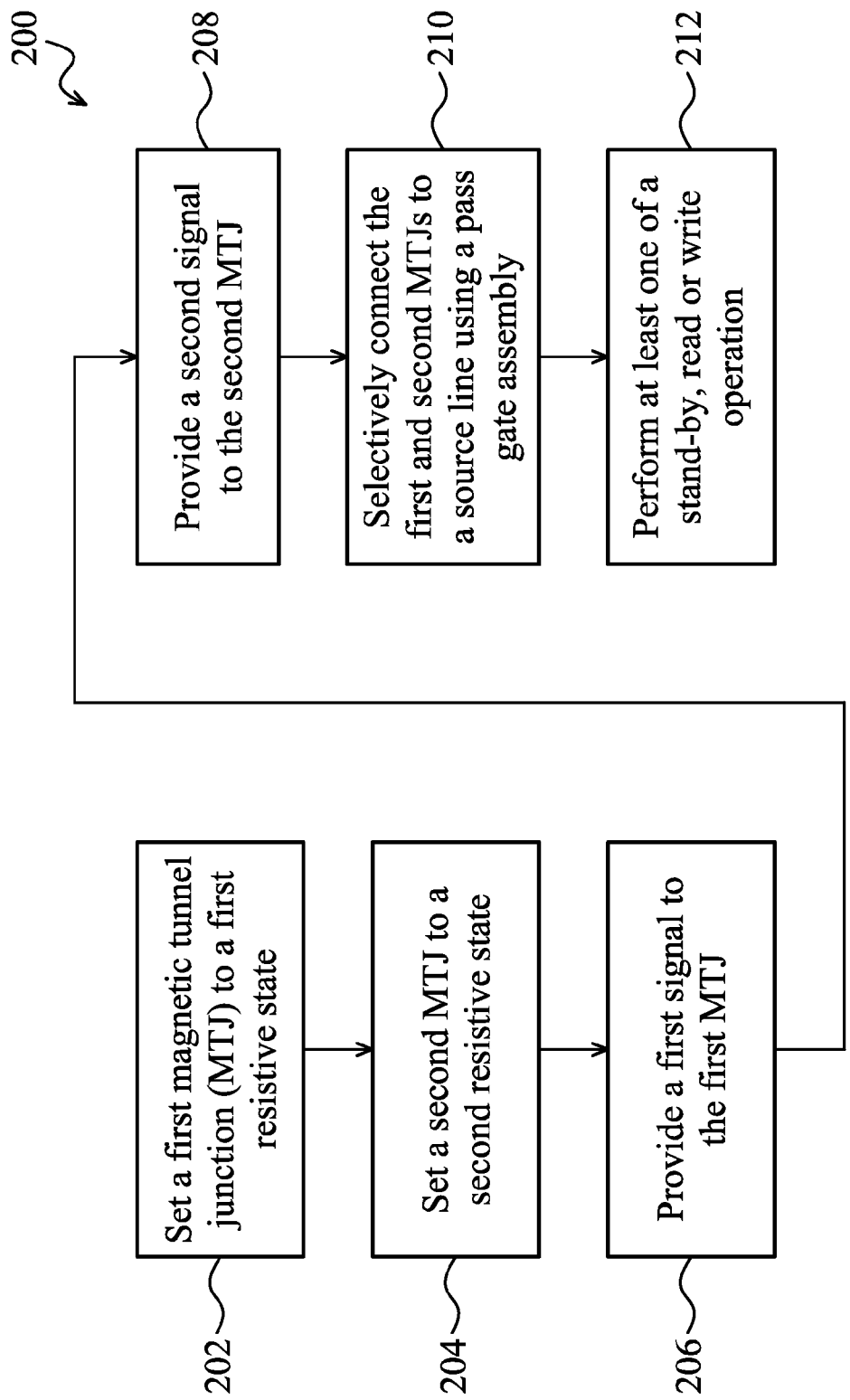
FIG. 2 is a flow chart of a method of using the MRAM bit cell in accordance with one or more embodiments.

FIG. 2 is a flow chart of a method 200 of operation of MRAM bit cell 100. Method 200 begins with operation 202 in which a first MTJ is set to a first resistive state. In MRAM bit cell 100, first MTJ 102 is set to a high resistive state. Method 200 continues with operation 204 in which a second MTJ is set to a second resistive state. In MRAM bit cell 100, second MTJ 104 is set to a low resistive state. In some embodiments, the first resistive state and the second resistive state are the same. For example, during a manufacturing process all MTJ are set to an initial resistive state, in some instances. In another example, in a two phase writing process, both MTJs will have the same resistive state between the two write processes.

Method 200 continues with operation 206 in which a first signal is provided to the first MTJ. In MRAM bit cell 100, bit line BL provides the first signal to first MTJ 102. In some embodiments, the first signal is equal to a reference voltage, e.g., VSS. In some embodiments, the first signal is equal to a supply voltage, e.g., VDD. In some embodiments, the first signal is equal to a pre-charge voltage between the reference voltage and the supply voltage. In some embodiments, the first signal has a different voltage value.

Method 200 continues with operation 208 in which a second signal is provided to the second MTJ. In MRAM bit cell 100, bit line bar BLB provides the second signal to second MTJ 104. In some embodiments, the second signal is equal to a reference voltage, e.g., VSS. In some embodiments, the second signal is equal to a supply voltage, e.g., VDD. In some embodiments, the second signal is equal to the pre-charge voltage between the reference voltage and the supply voltage. In some embodiments, the first signal has a different voltage value.

Method 200 continues with operation 210 in which the first and second MTJs are selectively connected to a source line using a pass gate assembly. In MRAM bit cell 100, first MTJ 102 and second MTJ 104 are selectively connected to source line SL by pass gate assembly 105. Pass gate assembly 105 is activated based on word line WL, so that if the word line WL is activated first MTJ 102 and second MTJ 104 are electrically connected to source line SL.

Method 200 continues with operation 212 in which at least one of a stand-by operation, a read operation or a write operation is performed. The details of each of these operations are discussed in turn below. FIG. 3 is a table of voltage values at various points in MRAM bit cell 100 for several operations of the MRAM bit cell, for some embodiments. FIG. 4 is a table of voltage values at various points in MRAM bit cell 100 for several operations of the MRAM bit cell, for some embodiments. The tables displayed in FIGS. 3 and 4 show examples of voltage values at word line WL, bit line BL, node A, node B, bit line bar BLB and source line SL. The operations include a stand-by operation, a read operation, a write operation that writes the low resistive state to MTJ 102, the high resistive state to MTJ 104, the high resistive state to first MTJ 102 and the low resistive state to second MTJ 104. A voltage value of 0V is considered as the reference voltage VSS. A voltage value of 1V is considered as the supply voltage VDD. In some embodiments, the reference voltage and the supply voltage have different values. The values for the reference voltage and the supply voltage are selected based on the design of MRAM bit cell 100.

Stand-By Operation

The stand-by operation occurs when MRAM bit cell 100 is storing data, but not receiving new data or outputting stored data. In some embodiments, MRAM bit cell 100 is disconnected from a power supply during the stand-by operation. In some embodiments, MRAM bit cell 100 remains connected to the power supply and bit line BL, bit line bar BLB and source line SL remain at a pre-charge voltage level. During a stand-by operation, word line WL is at the reference voltage, so pass gate assembly 105 is inactive and source line SL is electrically disconnected from first MTJ 102 and second MTJ 104. In addition, first MTJ 102 and second MTJ 104 are electrically disconnected from each other. In some embodiments, as displayed in FIG. 3, bit line BL, bit line bar BLB, source line SL, node A and node B are all at the reference voltage. In some embodiments, as displayed in FIG. 4, bit line BL, bit line bar BLB, source line SL, node A and node B are at a pre-charge voltage level between the reference voltage and the supply voltage. In some embodiments, the pre-charge voltage level is equal to 0.2V. In some embodiments, the pre-charge voltage level is greater than or less than 0.2V. In both FIG. 3 and FIG. 4, the voltage value of bit line BL, bit line bar BLB and source line SL are equal, therefore, no potential difference exists to drive a current through first MTJ 102 and second MTJ 104.

The reduced size of pass gate transistors 106, 108 and 110 provides an additional benefit of reduced leakage during the stand-by operation. Charge stored in first MJT 102 or second MJT 104 potentially leaks through second pass gate transistor 108 or third pass gate transistor 110 to source line SL, even with the second and third pass gate transistors in the inactive state. However, the reduced size of second pass gate transistor 108 and third pass gate transistor 110 reduces an amount of potential leakage in comparison with other MRAM bit cell designs because less current is able to escape through the smaller channel of the pass gate transistors 108 and 110. The reduction in current leakage helps to conserve more power and maintain a higher accuracy of data read from or written to MRAM bit cell 100 in comparison with other MRAM bit cell designs.

Read Operation

The read operation occurs when data stored in MRAM bit cell 100 is detected and transmitted to external circuitry. In the read operation, word line WL is at the supply voltage to activate pass gate assembly 105 to electrically connect first MTJ 102 and second MTJ 104 to source line SL. In the embodiments of FIG. 3, bit line BL and bit line bar BLB are at the pre-charged voltage value and source line SL remains at the reference voltage. The voltage difference between bit line BL and source line SL causes a current to flow from the bit line to the source line and reduce the voltage at node A to a value below the pre-charge voltage. Similarly, the voltage difference between bit line bar BLB and source line SL causes a current to flow from the bit line bar to the source line and reduce the voltage at node B to a value below the pre-charge voltage. The resistance of first MTJ 102 and second MTJ 104 determines a magnitude of each of the respective currents. A sense amplifier (FIG. 5) measures a current difference between bit line BL and bit line bar BLB. In this manner, the sense amplifier determines whether MRAM bit cell 100 stores a "1" or a "0".

In the embodiments of FIG. 4, bit line BL and bit line bar BLB remain at the pre-charge voltage value and source line SL is at the reference voltage. By maintaining a constant voltage value at bit line BL and bit line bar BLB, an impact of parasitic currents from BL to node A and from BLB to node B generated by changes in voltage values on non-selected cells belonging to a same column in a memory array containing MRAM bit cell 100 is avoided or reduced because the voltage at nodes A and B is substantially equal to the voltage of bit line BL and bit line bar BLB. The reduced parasitic currents minimize read disturb and the possibility for unintentional flipping of a resistive state of an MTJ in the non-selected cells. In addition, the read operation is more rapid because the time necessary to reduce source line SL from the pre-charge voltage value to the reference voltage is less than the time to pre-charge bit line BL and bit line bar BLB from the reference voltage to the pre-charge voltage due to a lower total capacitance of line SL. The shorter time allows more rapid development of the current difference on bit line BL and bit line bar BLB and earlier detection by the sense amplifier.

In comparison with other MRAM bit cell designs which include a single MTJ, MRAM bit cell 100, omits generation of a reference current for comparison with currents generated on bit line BL. Thus, an amount of external circuitry is reduced with respect to the other MRAM bit cell designs because no circuitry is necessary for generating the reference current. In addition, a potential source of error is eliminated because an error in the reference current potentially results in an incorrect read operation.

An additional advantage of MRAM bit cell 100, as a differential cell, in comparison with single-ended MRAM bit cell designs is an ability to generate a larger magnitude current difference. The magnitude of the current difference for MRAM bit cell 100 is two times greater than for the single-ended MRAM bit cell designs. The larger magnitude current difference reduces a size of the sense amplifier and shortens the time to perform the read operation.

Write Operation

The write operation occurs when new data is transmitted to MRAM bit cell 100 for storage. The write operation in the embodiments of FIGS. 3 and 4 are similar. The write operation occurs in two parts. In some embodiments, the write operation occurs during two different clock cycles for MRAM bit cell 100. In a first write operation, first MTJ 102 is set to a first resistive state. In a second write operation, second MTJ 104 is set to a second complementary resistive state.

During the write operation, word line WL is set to twice the supply voltage. Word line WL is set to twice the supply voltage in order to facilitate a higher current flow through pass gate transistors 106, 108 and 110, than when word line WL is set to the supply voltage. The ability to conduct higher currents enables faster writing operations.

To write a logic "0" in MRAM bit cell 100, first MTJ 102 is set to the low resistive state (RL) during a first writing cycle and then second MTJ 104 is set to the high resistive state (RH) during a second writing cycle. To write a logic "1" in MRAM bit cell 100, first MTJ 102 is set to the high resistive state (RH) during the first writing cycle and then second MTJ 104 is set to the low resistive state (RL) during the second writing cycle. In some embodiments, the relationship between the logic values and the resistive values for first and second MTJs 102 and 104 are reversed.

During writing of the logic "0" to MRAM bit cell 100, bit line BL is set to the supply voltage and bit line bar BLB is set to the reference voltage. The voltage values of bit line BL and bit line bar BLB do not change between the first writing cycle and the second writing cycle.

To set first MTJ 102 to the low resistive state, source line SL is set to the reference voltage. Source line SL being at the reference voltage creates a current in a direction from bit line BL to source line SL across first MTJ 102. Source line SL is connected to first MTJ 102 by a first electrical path through second pass gate transistor 108 and by a second electrical path through third pass gate transistor 110 and first pass gate transistor 106. The direction of the current sets the orientation of the free layer of first MTJ 102 in the same orientation as the pinned layer of the first MTJ. Source line SL being at the reference voltage creates no potential difference from bit line bar BLB to source line SL, so the resistive state of second MTJ 104 remains unchanged. More precisely, current flowing through the second electrical path creates a potential at the node B. However, taking into account that an MTJ has a significantly larger resistance than total resistance of the second electrical path, the potential at the node B is close to the reference voltage, as seen in the embodiments of FIGS. 3 and 4. The potential at node B is not sufficient to change the resistive state of second MTJ 104.

To set second MTJ 104 to the high resistive state, source line SL is set to the supply voltage. Source line SL being the supply voltage creates a current in the direction from source line SL to bit line BL across second MTJ 104. Source line SL is connected to second MTJ 104 by a first electrical path through third pass gate transistor 110 and by a second electrical path through second pass gate transistor 108 and first pass gate transistor 106. A voltage at node B is greater than a voltage at node A because a voltage drop across third pass gate transistor 110 is less than a combined voltage drop across first and second pass gate transistors 106 and 108. The direction of the current sets the orientation of the free layer of second MTJ 104 in the opposite orientation from the pinned layer of the second MTJ. Source line SL being at the supply voltage creates no potential difference from bit line BL to source line SL, so the resistive state of first MTJ 102 remains unchanged. Following these two write steps, a logic "0" is stored in MRAM bit cell 100.

During writing of the logic "1" to MRAM bit cell 100, bit line BL is set to the reference voltage and bit line bar BLB is set to the supply voltage. The voltage values of bit line BL and bit line bar BLB do not change between the first writing cycle and the second writing cycle.

Independently on written data, line SL can stay at the reference level when setting the resistive state of first MTJ 102 and at the supply voltage when setting the resistive state of second MTJ 104.

To set second MTJ 104 to the low resistive state, source line SL is set to the reference voltage. Source line SL being the reference voltage creates a current in the direction from bit line BL to source line SL across second MTJ 104. Source line SL is connected to second MTJ 104 by the first electrical path through third pass gate transistor 110 and by the second electrical path through second pass gate transistor 108 and first pass gate transistor 106. The direction of the current sets the orientation of the free layer of second MTJ 104 in the same orientation as the pinned layer of the second MTJ. Source line SL being at the reference voltage creates no potential difference from bit line BL to source line SL, so the resistive state of first MTJ 102 remains unchanged. Current flowing through the second electrical path creates a potential at the node A. However, taking into account that an MTJ has a significantly larger resistance than total resistance of the second electrical path, the potential at the node A is close to the reference voltage, as seen in the embodiments of FIGS. 3 and 4.

To set first MTJ 102 to the high resistive state, source line SL is set to the supply voltage. Source line SL being the supply voltage creates a current in the direction from source line SL to bit line BL across first MTJ 102. Source line SL is connected to first MTJ 102 by a first electrical path through second pass gate transistor 108 and by a second electrical path through third pass gate transistor 110 and first pass gate transistor 106. A voltage at node A is greater than a voltage at node B because a voltage drop across first pass gate transistor 106 is less than a combined voltage drop across second and third pass gate transistors 108 and 110. The direction of the current sets the orientation of the free layer of first MTJ 102 in the opposite orientation from the pinned layer of the first MTJ. Source line SL being at the supply voltage creates no potential difference from bit line bar BLB to source line SL, so the resistive state of second MTJ 104 remains unchanged.

Following these two write steps, a logic "1" is stored in MRAM bit cell 100. The voltage values described above and displayed in FIGS. 3 and 4 are used for illustrative purposes, different voltage values for stand-by, read and write operations are encompassed within the scope of this description.

MRAM Block-Diagram

Figure 5:
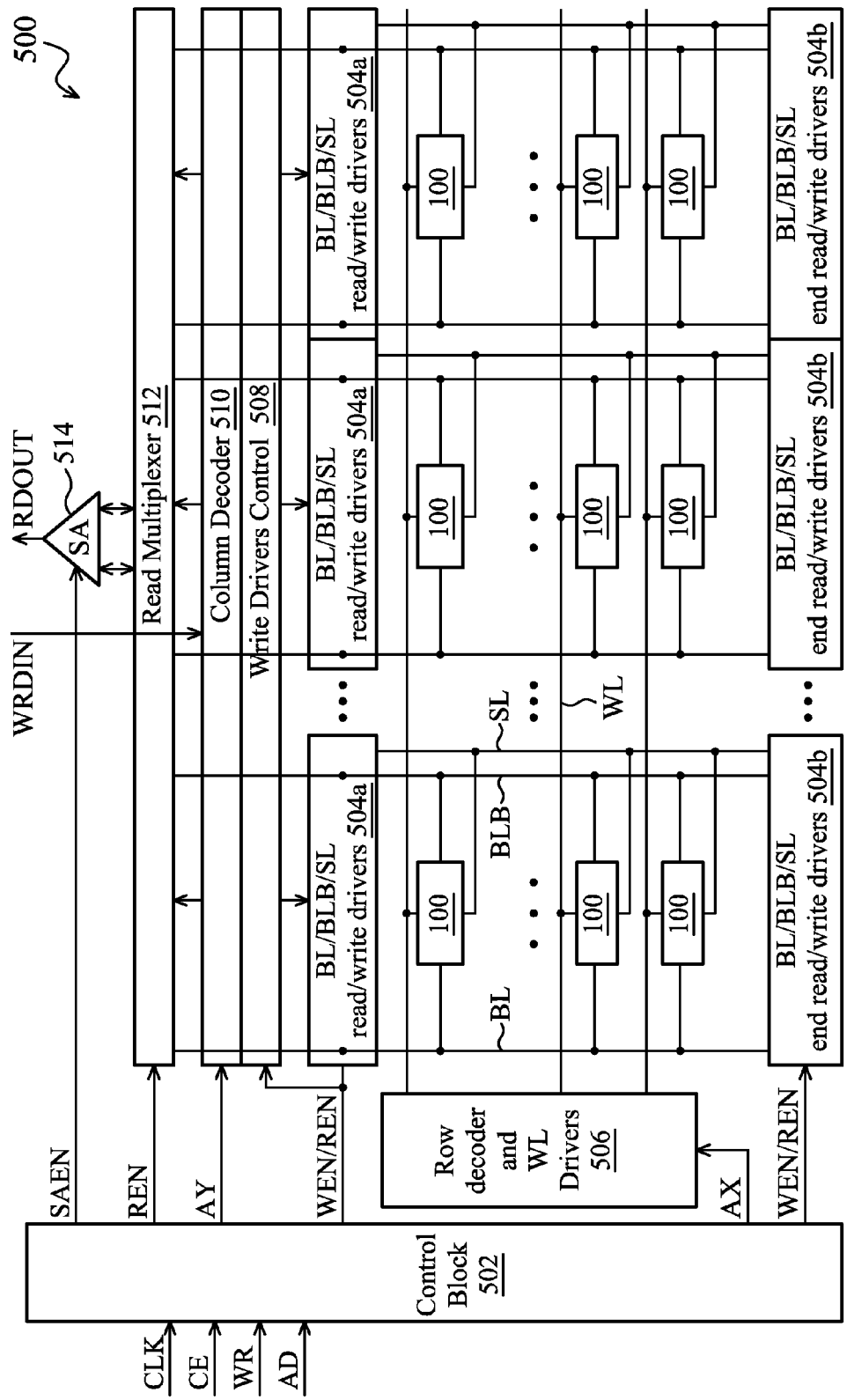
FIG. 5 is a schematic diagram of a memory circuit including the MRAM bit cell in accordance with one or more embodiments.

FIG. 5 is a schematic diagram of a memory circuit 500 including MRAM bit cells 100. Memory circuit 500 includes an array of MRAM bit cells 100 arranged in rows and columns. Memory circuit 500 also includes a plurality of bit lines BL, bit line bars BLB, source lines SL and word lines WL, for simplicity only one bit line BL, bit line bar BLB, source line SL and word line WL are labeled. Each MRAM bit cell 100 is connected to one bit line BL, one bit line bar BLB, one source line SL and one word line WL. MRAM bit cells 100 in a same column share a common bit line BL, bit line bar BLB and source line SL. MRAM bit cells 100 in a same row share a common word line WL.

Memory circuit 500 includes a control block 502 configured to receive various signals from external circuitry related to memory circuit 500. Control block 502 is connected to read/write drivers 504a and end read/write drivers 504b configured to control the voltage value of bit line BL, bit line bar BLB and source line SL. Control block 502 is also connected to a row decoder and word line driver 506 configured to control the voltage value of word line WL and determine a row address for a selected cell. Control block 502 is also connected to a write drivers control 508 configured to control read/write drivers 504a and end read/write drivers 504b. Control block 502 is connected to a column decoder 510 configured to determine a column address for the selected cell. Control block 502 is also connected to a read multiplexer 512 configured to combine several column outputs into a single output. Control block 502 is also connected to a sense amplifier 514 configured to enhance the single output received from read multiplexer 512 and generate an output signal RDOUT.

In operation, control block 502 receives a clock signal CLK, a chip enable signal CE, a write signal WR and an address signal AD. Clock signal CLK is used to determine clock cycles for memory circuit 500. For example, during the write operation described above in some embodiments, the first write cycle would occur during one clock cycle determined based on clock signal CLK and the second write cycle would occur during another clock cycle. Chip enable signal CE is used to selectively activate memory circuit 500. Input data signal WRDIN carries information to be written to the selected MRAM bit cell 100. Address signal AD contains an address of the selected MRAM bit cell 100.

Control block 502 processes signals CLK, CE and WR and provides control signals to various components of memory circuit 500. If write signal WR indicates a write operation, control block 502 sends a write enable signal WEN to read/write drivers 504a, end read/write drivers 504b and write drivers control 508. Based on write enable signal WEN, bit line BL, bit line bar BLB and source line SL are charged. Examples of the voltage values for write operations are displayed in FIGS. 3 and 4. If write signal WR indicates a read operation, i.e., write signal contains no information to write, but chip enable signal CE indicates memory circuit 500 is to perform an operation, control block 502 sends a read enable signal REN to read/write drivers 504a, end read/write drivers 504b and read multiplexer 512. Control block 502 also sends a sense amplifier enable signal SAEN to sense amplifier 514 to activate the sense amplifier. Based on read enable signal REN, read multiplexer 512 is activated. Read/write drivers 504a and end read/write drivers 504b charge bit line BL, bit line bar BLB and source line SL for a read operation. If chip enable signal CE is at a low logic level, memory circuit 500 performs a stand-by operation. Examples of the voltage values for read operations are displayed in FIGS. 3 and 4.

Control block 502 also processes address signal AD and provides control signals to various components of memory circuit 500. A column address signal AY is transmitted to column decoder 510 to identify the column of the selected MRAM bit cell 100. Based on column address signal AY, column decoder 510 selectively activates read/write drivers 504a and end read/write drivers 504b of the identified column. The remaining read/write drives 504a and end read/write drivers 504b remain inactive to avoid inadvertent write into non-selected MRAM bit cells 100. A row address signal AX is transmitted to row decoder and word line driver 506 to identify the row of the selected MRAM bit cell 100. Based on row address signal AX, row decoder and word line driver 506 selectively activates word line WL connected to the selected MRAM bit cell 100.

The inclusion of both read/write drivers 504a and end read/write drivers 504b helps to ensure sufficient current is provided to MRAM bit cells 100 to facilitate changes to the resistive states of MTJs within the MRAM bit cells. By including both read/write drivers 504a and end read/write drivers 504b, voltage drop along bit line BL, bit line bar BLB and source line SL, is reduced so that read and write operations occur at substantially similar speeds regardless of a position of MRAM bit cell 100 within a column. In some instances, if the voltage drop due to resistance inherently within bit line BL, bit line bar BLB or source line SL is too large a read or write operation will not be completed within the clock cycle and erroneous data is written to or read from MRAM bit cell 100.

An aspect of the present description relates to a magnetoresistive random access memory (MRAM) bit cell. The MRAM bit cell includes a first magnetic tunnel junction (MTJ) connected to a first data line and a second MTJ connected to a second data line The MRAM bit cell further includes a first transistor having a first terminal connected to the first MTJ and a second terminal connected to the second MTJ. The MRAM bit cell further includes a second transistor having a first terminal connected to a driving line and a second terminal connected to the first MTJ. The MRAM bit cell further includes a third transistor having a first terminal connected to the driving line and a second terminal connected to the second MTJ.

Another aspect of the present description relates to a magnetoresistive random access memory (MRAM) bit cell. The MRAM bit cell includes a first magnetic tunnel junction (MTJ) connected to a first data line and a second MTJ connected to a second data line. The MRAM bit cell further includes a transistor assembly configured to selectively connect the first MTJ and the second MTJ to a driving line. The transistor assembly includes a first electrical path for selectively connecting the first MTJ to the driving line and a second electrical path, different from the first electrical path, for selectively connecting the first MTJ to the driving line. The transistor assembly further includes a third electrical path for selectively connecting the second MTJ to the driving line and a fourth electrical path, different from the third electrical path, for selectively connecting the second MTJ to the driving line.

Still another aspect of the present description relates to a method of using a magnetoresistive random access memory (MRAM) bit cell. The method includes setting a first magnetic tunnel junction (MTJ) to a first resistive state and setting a second MTJ to a second resistive state. The method further includes providing a first signal to the first MTJ and providing a second signal to the second MTJ. The method further includes selectively connecting the first MTJ and the second MTJ to a driving line using a transistor assembly and performing at least one of a stand-by operation, a read operation or a write operation.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A magnetoresistive random access memory (MRAM) bit cell, comprising:
   a first magnetic tunnel junction (MTJ) connected to a first data line;
   a second MTJ connected to a second data line
   a first transistor having a first terminal connected to the first MTJ and a second terminal connected to the second MTJ;
   a second transistor having a first terminal connected to a driving line and a second terminal connected to the first MTJ; and
   a third transistor having a first terminal connected to the driving line and a second terminal connected to the second MTJ.

2. The MRAM bit cell of claim 1, wherein a gate of the first transistor is connected to
   a gate of the second transistor,
   a gate of the third transistor, and
   a control line.

3. The MRAM bit cell of claim 1, wherein the second terminal of the second transistor is connected to the first terminal of the first transistor.

4. The MRAM bit cell of claim 1, wherein the second terminal of the third transistor is connected to the second terminal of the first transistor.

5. The MRAM bit cell of claim 1, wherein the driving line is selectively connected to the first MTJ through
   a first path through the second transistor, and
   a second path through the third transistor and the first transistor.

6. The MRAM bit cell of claim 1, wherein the driving line is selectively connected to the second MTJ through
   a first path through the third transistor, and
   a second path through the second transistor and the first transistor.

7. A magnetoresistive random access memory (MRAM) bit cell, comprising:
   a first magnetic tunnel junction (MTJ) connected to a first data line;
   a second MTJ connected to a second data line; and
   a transistor assembly configured to selectively connect the first MTJ and the second MTJ to a driving line, the transistor assembly comprising:
      a first electrical path for selectively connecting the first MTJ to the driving line;
      a second electrical path, different from the first electrical path, for selectively connecting the first MTJ to the driving line;
      a third electrical path for selectively connecting the second MTJ to the driving line; and
      a fourth electrical path, different from the third electrical path, for selectively connecting the second MTJ to the driving line.

8. The MRAM bit cell of claim 7, wherein the pass gate assembly comprises:
a first transistor having a gate connected to a control line;
a second transistor having a gate connected to the control line; and
a third transistor having a gate connected to the control line.

9. The MRAM bit cell of claim 7, wherein
the first electrical path comprises a first transistor,
the second electrical path comprises a second transistor and a third transistor,
the third electrical path comprises the second transistor, and
the fourth electrical path comprises the first transistor and the third transistor.

10. A method of using a magnetoresistive random access memory (MRAM) bit cell, the method comprising:
setting a first magnetic tunnel junction (MTJ) to a first resistive state;
setting a second MTJ to a second resistive state;
providing a first signal to the first MTJ;
providing a second signal to the second MTJ;
selectively connecting the first MTJ and the second MTJ to a driving line using a transistor assembly; and
performing at least one of a stand-by operation, a read operation or a write operation.

11. The method of claim 10, wherein the read operation is performed, the read operation comprising:
setting the first signal and the second signal to a pre-charge voltage;
setting the driving line to a reference voltage; and
connecting the first MTJ and the second MTJ to the driving line.

12. The method of claim 11, wherein connecting the first MTJ and the second MTJ to the driving line comprises activating the transistor assembly using a control line set to a supply voltage.

13. The method of claim 10, further comprising transitioning from the stand-by operation to the read operation, where the transitioning comprises:
maintaining the first and second signal at a pre-charge voltage; and
reducing a voltage on the driving line to a reference voltage; and
connecting the first MTJ and the second MTJ to the driving line.

14. The method of claim 10, wherein selectively connected the first MTJ and the second MTJ to the driving line comprises activating the transistor assembly using a control line.

15. The method of claim 14, wherein
if the stand-by operation is performed, setting the control line to a first voltage level,
if the read operation is performed, setting the control line to a second voltage level greater than the first voltage level, and
if the write operation is performed, setting the control line to a third voltage level greater or equal to the second voltage level.

16. The method of claim 10, wherein the stand-by operation is performed, the stand-by operation comprising:
setting the first signal, the second signal and the driving line to either a reference voltage or a pre-charge voltage; and
disconnecting the first MTJ and the second MTJ from the driving line.

17. The method of claim 10, wherein the write operation is performed, the write operation comprising:
passing a first current through the first MTJ in a first direction during a first write cycle; and
passing a second current through the second MTJ in a second direction, opposite the first direction, during a second write cycle.

18. The method of claim 17, wherein the write operation further comprises
setting the source line to a first voltage level during the first write cycle; and
setting the source line to a second voltage level, different than the first voltage level, during the second write cycle.

19. The method of claim 17, wherein the write operation further comprises
maintaining a voltage level of the first signal during the first and second write cycles; and
maintaining a voltage level of the second signal during the first and second write cycles.

20. The method of claim 10, wherein selectively connecting the first MTJ to the driving line comprises:
selectively connecting the first MTJ to the driving line through a first electrical path, and
selectively connecting the first MTJ to the driving line through a second electrical path, different from the first electrical path; and
selectively connecting the second MTJ to the driving line comprises:
selectively connecting the second MTJ to the driving line through a third electrical path, and
selectively connecting the second MTJ to the driving line through a fourth electrical path, different from the third electrical path.

* * * * *